(12) United States Patent
Uematsu et al.

(10) Patent No.: US 6,787,710 B2
(45) Date of Patent: Sep. 7, 2004

(54) WIRING BOARD AND A METHOD FOR MANUFACTURING THE WIRING BOARD

(75) Inventors: Yoshiaki Uematsu, Tokyo (JP); Shinji Manabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 224 days.

(21) Appl. No.: 09/986,282

(22) Filed: Nov. 8, 2001

(65) Prior Publication Data

US 2002/0179332 A1 Dec. 5, 2002

(30) Foreign Application Priority Data

May 29, 2001 (JP) ........................................ 2001-160417

(51) Int. Cl.⁷ .............................. H05K 1/11; H01R 12/04
(52) U.S. Cl. ........................ 174/261; 174/255; 174/261; 361/792; 361/795
(58) Field of Search ................................ 174/261, 262, 174/264, 265, 266, 255, 258; 361/792, 793, 794, 795, 803; 29/852, 830, 846

(56) References Cited

U.S. PATENT DOCUMENTS 5,421,083 A * 6/1995 Suppelsa et al. ............ 174/250
5,502,893 A * 4/1996 Endoh et al. ................. 29/847
5,949,030 A * 9/1999 Fasano et al. ............... 174/262

FOREIGN PATENT DOCUMENTS

| JP | 2-94693 | | 4/1990 |
|---|---|---|---|
| JP | 404062894 A | * | 2/1992 |
| JP | 6-37416 | | 2/1994 |
| JP | 6-216477 | | 8/1994 |
| JP | 11-74644 | | 3/1999 |
| JP | 02001053397 A | * | 2/2001 |

* cited by examiner

Primary Examiner—David L. Talbott
Assistant Examiner—I B Patel
(74) Attorney, Agent, or Firm—Oblon, Spivak, McClelland, Maier & Neustadt, P.C.

(57) ABSTRACT

In holes formed in a multi-layer wiring board for transmitting differential signals, a first hole is formed, an insulating portion is formed by filling the first hole with an insulating resin, a pair of second holes is formed for transmitting the differential signals to the formed insulating portion, and the pair of second holes is arranged symmetrically each other with respect to a center axis of the first hole for forming a coaxial structure.

16 Claims, 11 Drawing Sheets

WIRING BOARD AND A METHOD FOR MANUFACTURING THE WIRING BOARD

BACKGROUND OF THE INVENTION

1. Field of the Invention

This invention relates to a structure of a hole in differential wiring in a multi-layer wiring board.

2. Description of the Related Art

FIG. 8 illustrates an example of a connection by a through-hole for connecting wiring patterns 6 and 7 in the differential wiring and wiring patterns 8 and 9 in the differential wiring in the multi-layer wiring board according to the related art.

FIG. 9 shows a cross-sectional view of the multi-layer wiring board in a direction of a thickness of the multi-layer wiring board. FIG. 10 shows a cross-sectional view along III—III line in FIG. 9.

The multi-layer wiring board includes the wiring patterns 6 and 7 and insulating layers 3, 4 and 5 formed to sandwich electric power or ground layers 1 and 2. The wiring patterns 6 and 7 are facing the insulating layer 3 and the electric power or ground layer 1. The wiring patterns 6 and 7 constitute a differential micro strip line or strip line. The wiring patterns 8 and 9 are facing the insulating layer 5 and the electric power or ground layer 2. The wiring patterns 8 and 9 constitute the differential micro strip line or strip line. For connecting the wiring pattern 6 and the wiring pattern 8 which are different signal layers, a hole is formed through the multi-layer wiring board at first, and a circumference of the hole is plated with a conducting material to form a through-hole 19. A through-hole 20 connecting the wiring pattern 7 and the wiring pattern 9 is formed in the same way.

The differential wiring is realized through a following procedure. At first, when a signal is transmitted to a wiring pattern (called as "a first wiring pattern"), a complete reverse phase signal is transmitted to an adjacent wiring pattern (called as "a second wiring pattern"). Then, the signal transmitted to the first wiring pattern and the signal transmitted to the second wiring pattern are coupled in an electromagnetic field. Two wiring patterns become a pair and transmit the signals as one signal. As stated, the differential wiring is used for realizing a transmission method which has less influence of an external noise. Since phases of two wiring patterns in the differential wiring are constantly reverse each other, one of two wiring patterns is called as positive (+) side and another one is called as negative (−) side. When a high speed signal is transmitted to the wiring patterns of differential pair, an impedance and a coupling in the differential wiring are controlled by selecting an appropriate pattern width, pattern interval, thickness of the layers and thickness of an insulating layer in the multi-layer wiring board, and dielectric constant of an insulator. Accordingly, the signal are transmitted efficiently.

SUMMARY OF THE INVENTION

For most of through-holes in the multi-layer wiring boards according to the related art, the impedance was not considered at all. Japanese Unexamined Published Patent Application Hei 6-37416 discloses a through-hole in which the impedance is considered. FIG. 11 illustrates an example. In FIG. 11, a through-hole 31 includes a first copper plating portion 32 for a signal, located at a center, a second copper plating portion 34 including a ground potential, surrounding the first copper plating portion 32, and an insulating portion 33 filling a space between the first copper plating portion 32 and the second copper plating portion 34. The through-hole 31 constitutes a coaxial cable structure. In this way, the impedance is controlled.

However, in the through-hole structure according to the related art, for the wiring patterns in the differential wiring, a differential pair is not coupled. Therefore, a tolerance to the external noise, which is the characteristics of a differential signal, becomes lower.

It is one of objects of this invention to structure a transmission line system in which a reflection is suppressed by preventing an anomaly in the impedance between the wiring patterns in the differential wiring and the hole.

It is another object of this invention to increase the tolerance to the external noise by structuring the hole by a pair in the differential wiring, coupling the holes in the electromagnetic field and selecting a length (distance, width) between the holes coupled as the pair in the differential wiring and a dielectric constant of an insulating resin appropriately so that the differential pair is coupled firmly.

According to an aspect of this invention, a wiring board includes a base board, a first hole, formed through the base board, including an insulating portion filled with an insulator and a pair of second holes formed within the first hole through the insulating portion.

According to another aspect of this invention, a method for manufacturing a wiring board includes forming a first hole through a base board, forming an insulating portion by filling the first hole with an insulator and forming a pair of second holes through the insulating portion.

According to another aspect of this invention, a method for manufacturing the wiring board includes forming a first hole through a base board including conductor layers at an upper surface and a lower surface, forming an insulating portion by filling the first hole with an insulator, forming insulating layers on both the upper surface and the lower surface of the base board by using the insulator and forming a pair of second holes through the insulating portion and the insulating layers.

Further features and applications of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Other objects features, and advantages of the invention will be apparent from the following description when taken in conjunction with the accompany drawings.

DETAILED DESCRIPTION OF THE PREFERRED EMBODIMENTS

Embodiment 1.

Figure 1:
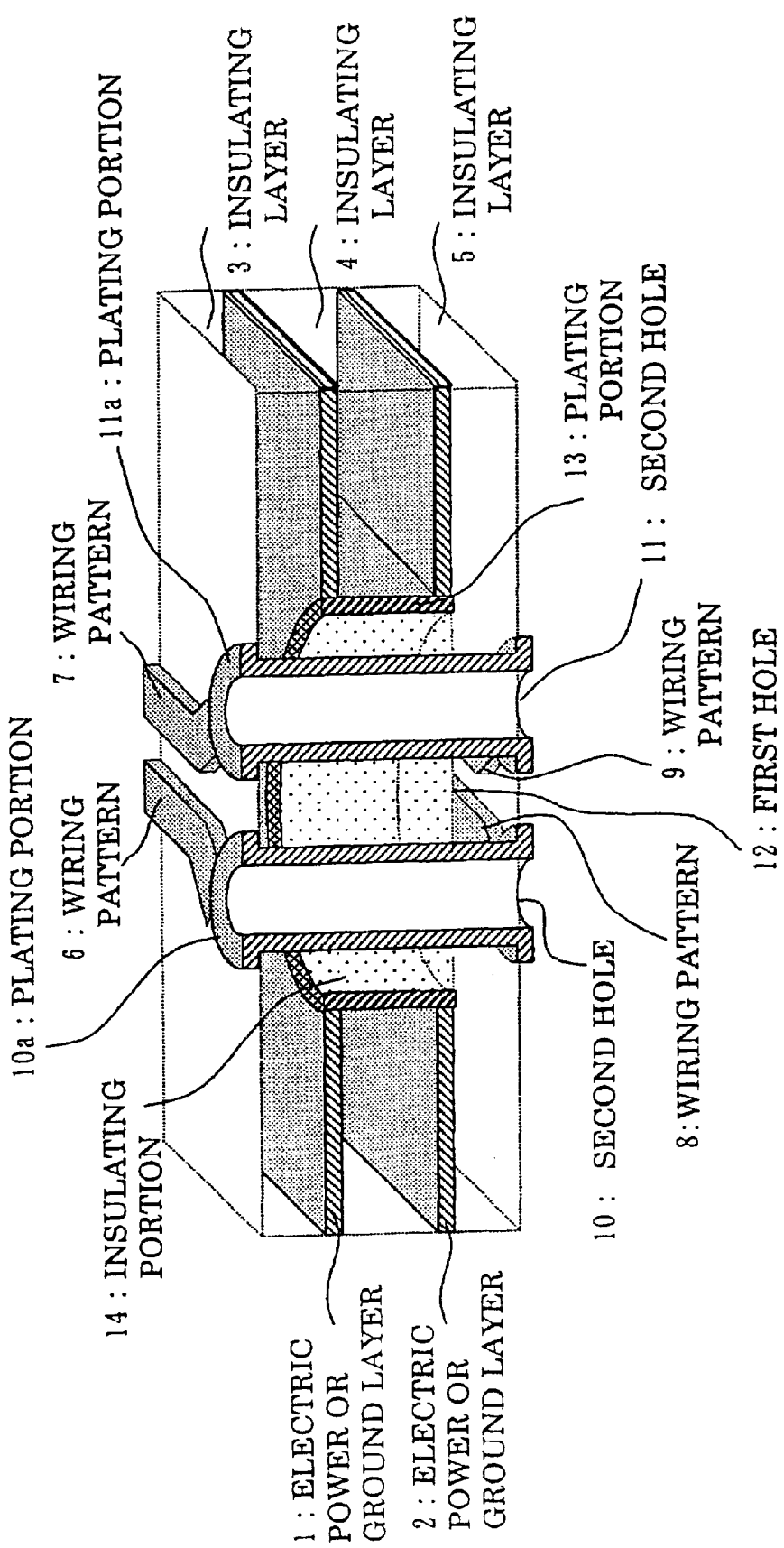
FIG. 1 illustrates an example of a structure of a multi-layer wiring board according to Embodiment 1 of this invention.
Figure 2:
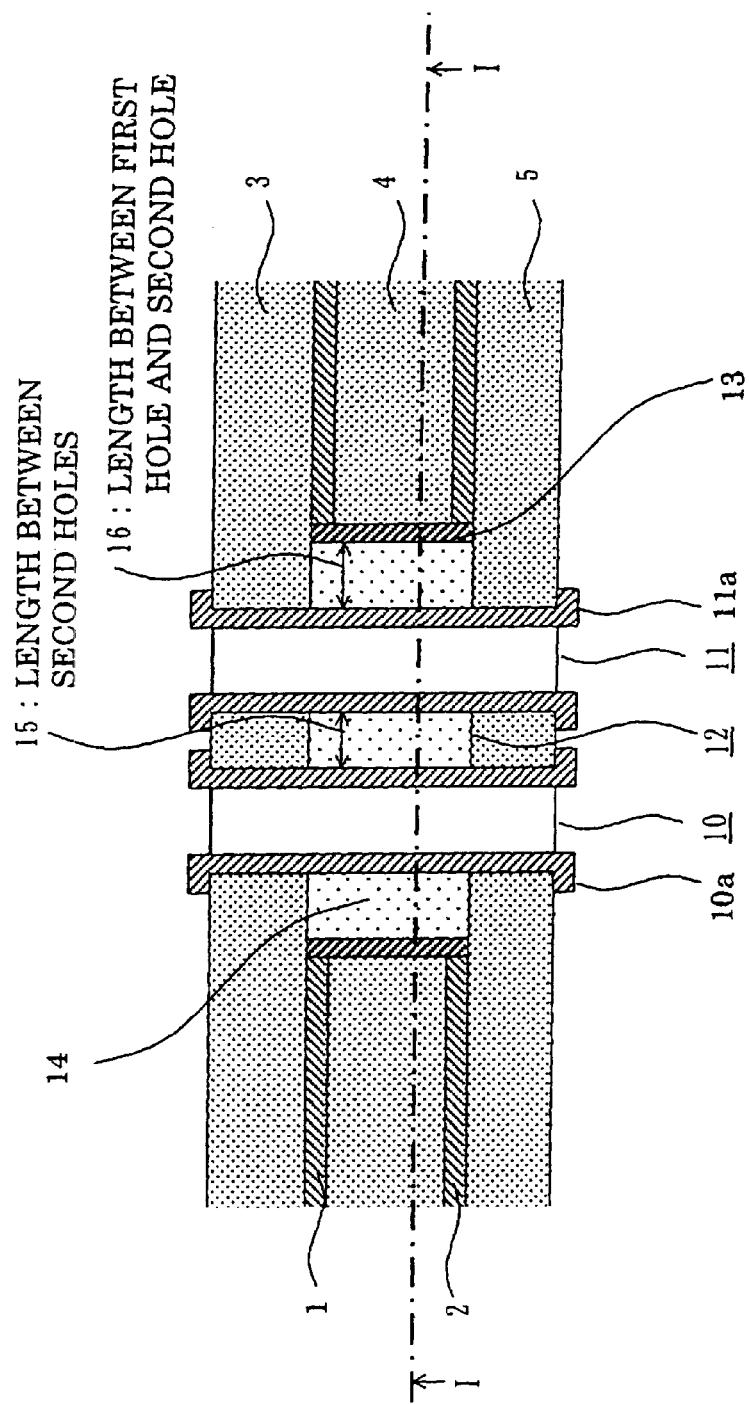
FIG. 2 illustrates a cross-sectional view of the structure of the multi-layer wiring board in FIG. 1.
Figure 3:
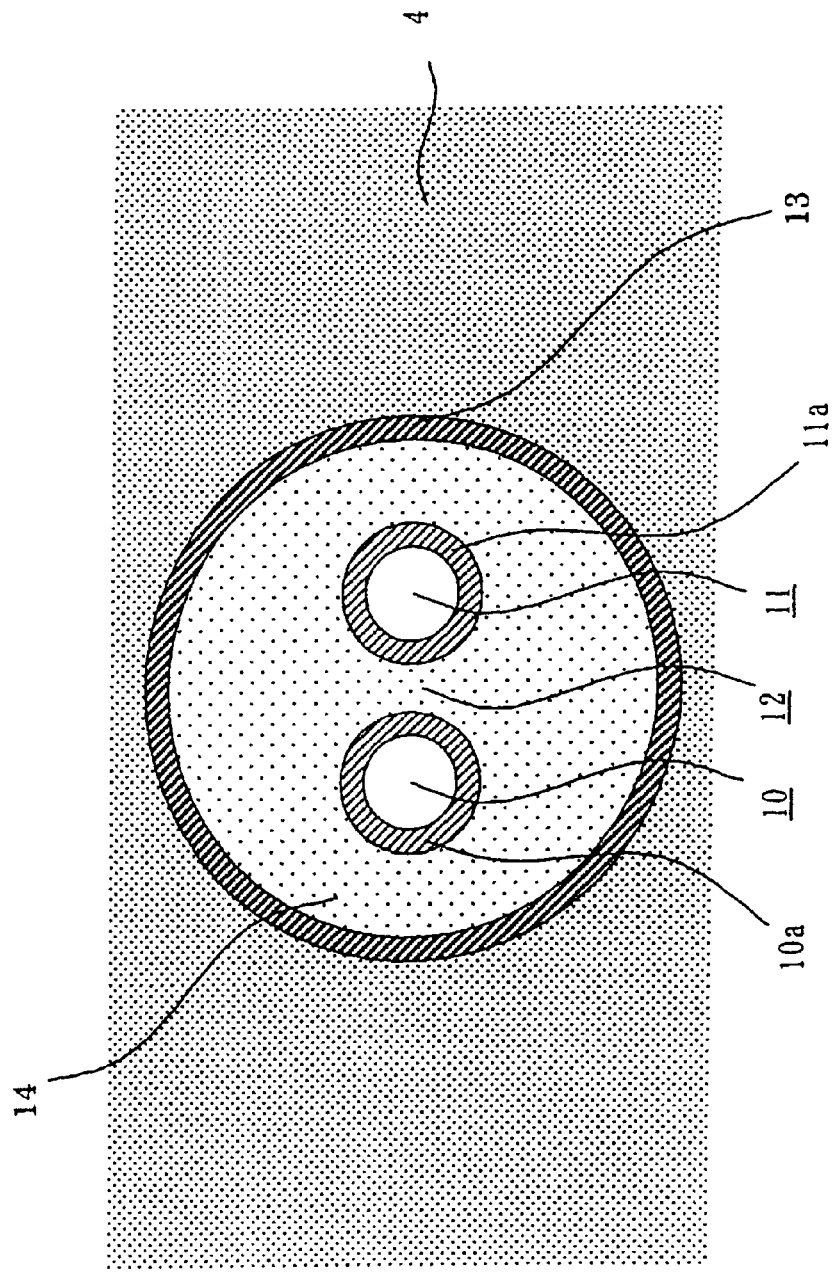
FIG. 3 illustrates a cross-sectional view of the structure along I—I line in FIG. 2.
Figure 8:
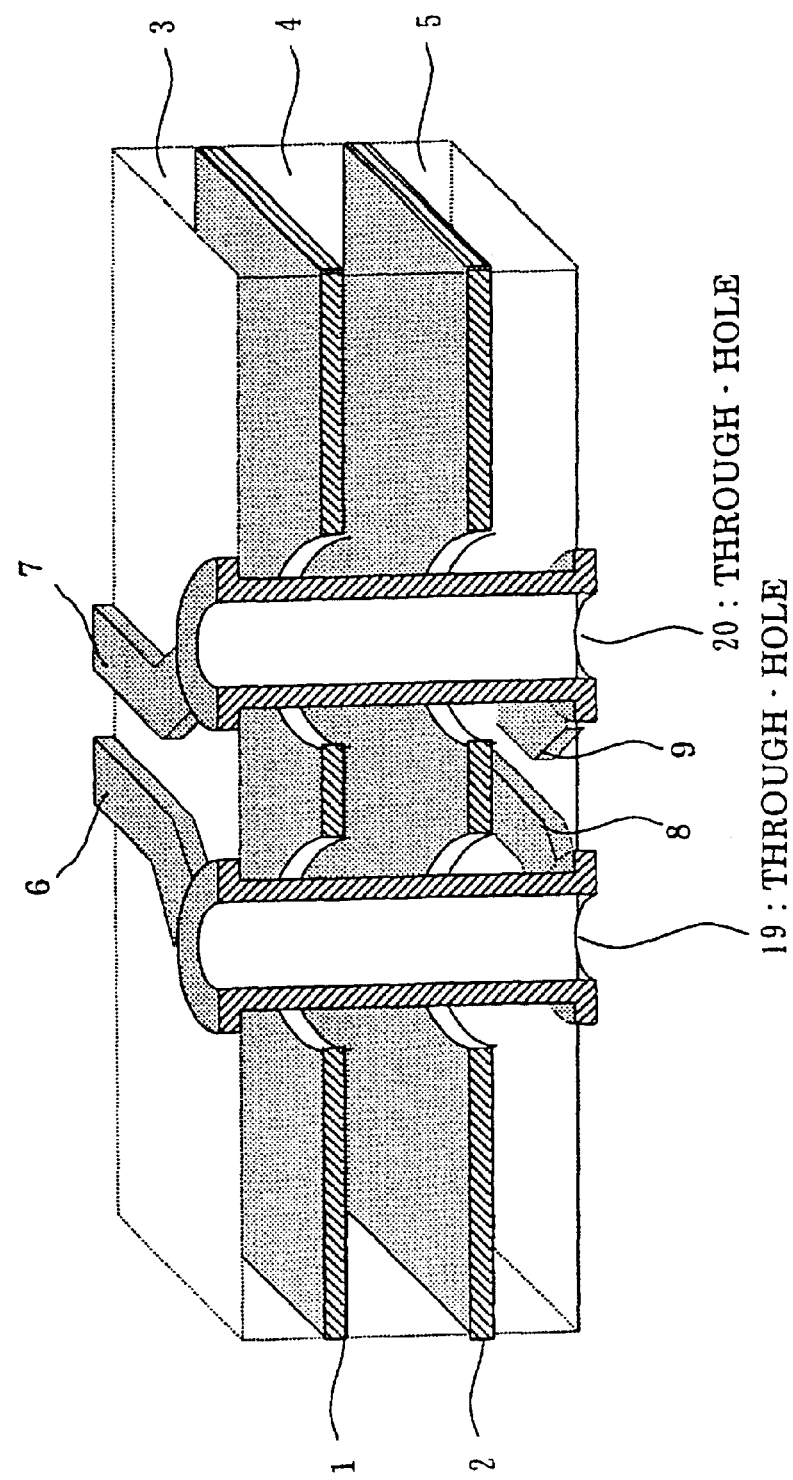
FIG. 8 illustrates a partially-broken perspective view of the multi-layer wiring board for showing a structure according to the related art.
Figure 9:
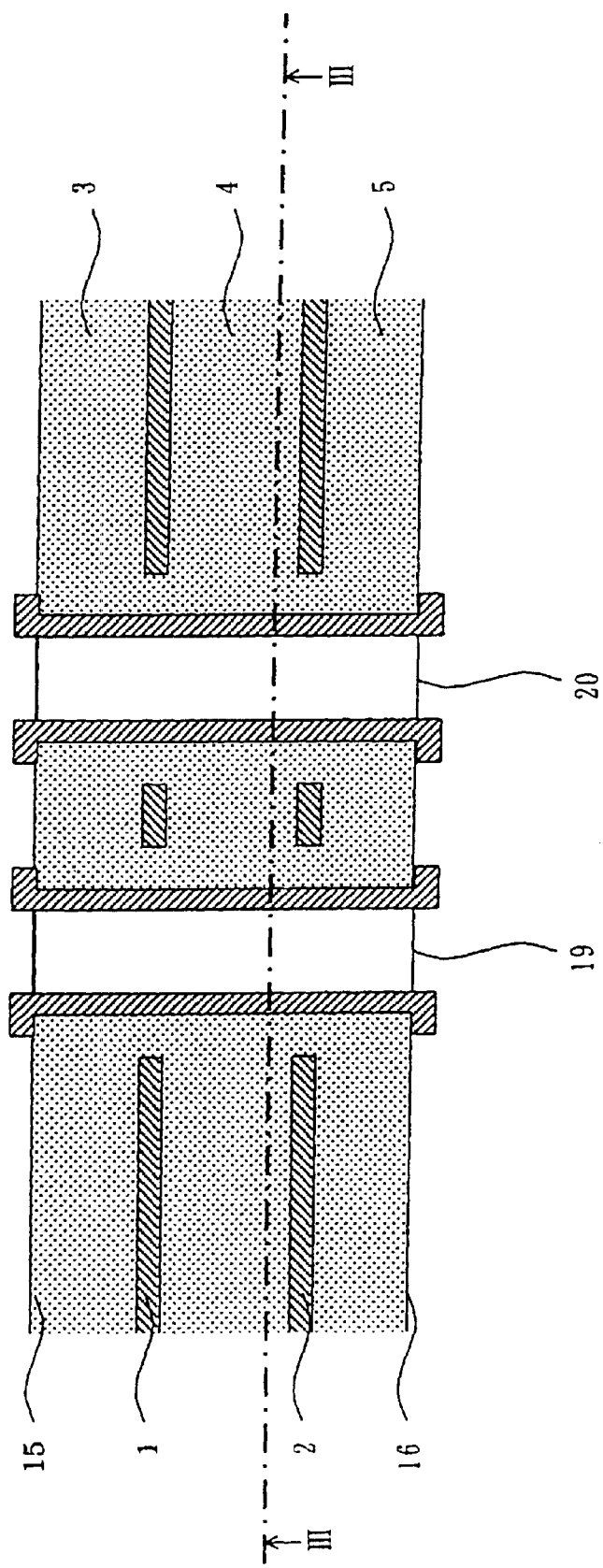
FIG. 9 illustrates a cross-sectional view of the structure of the multi-layer wiring board in FIG. 8.
Figure 10:
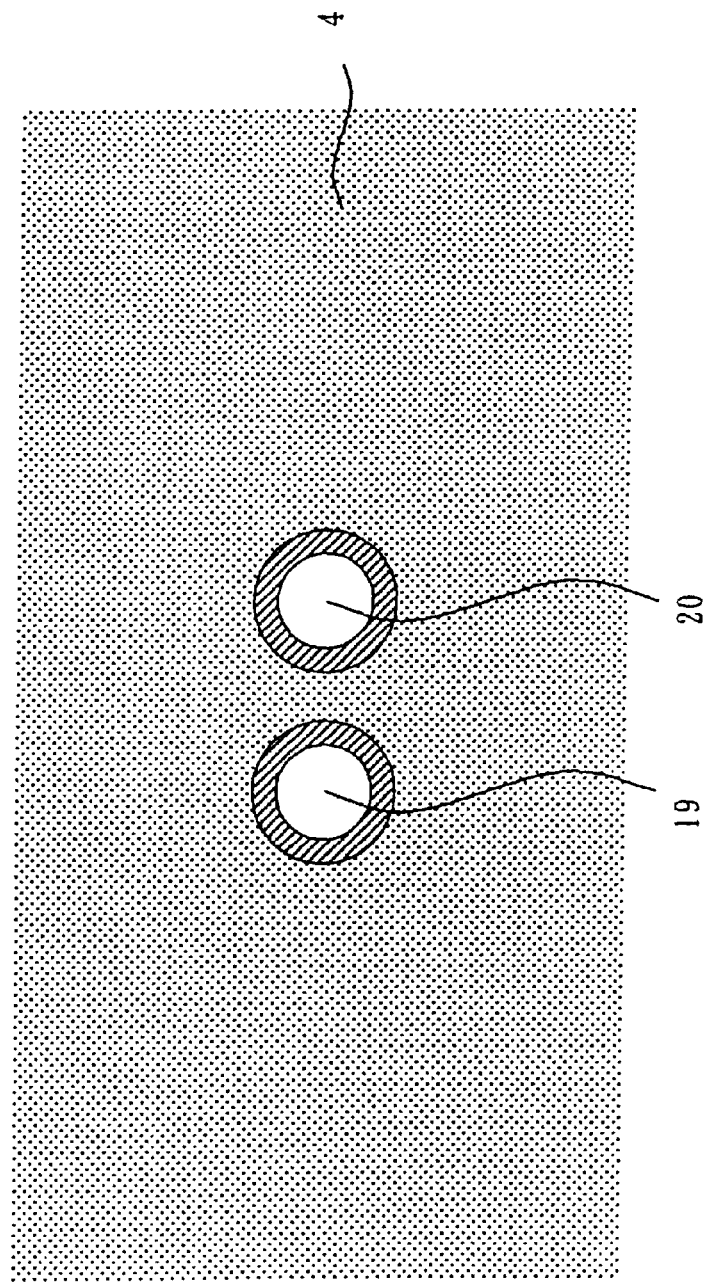
FIG. 10 illustrates a cross-sectional structure along III—III line in FIG. 9.
Figure 11:
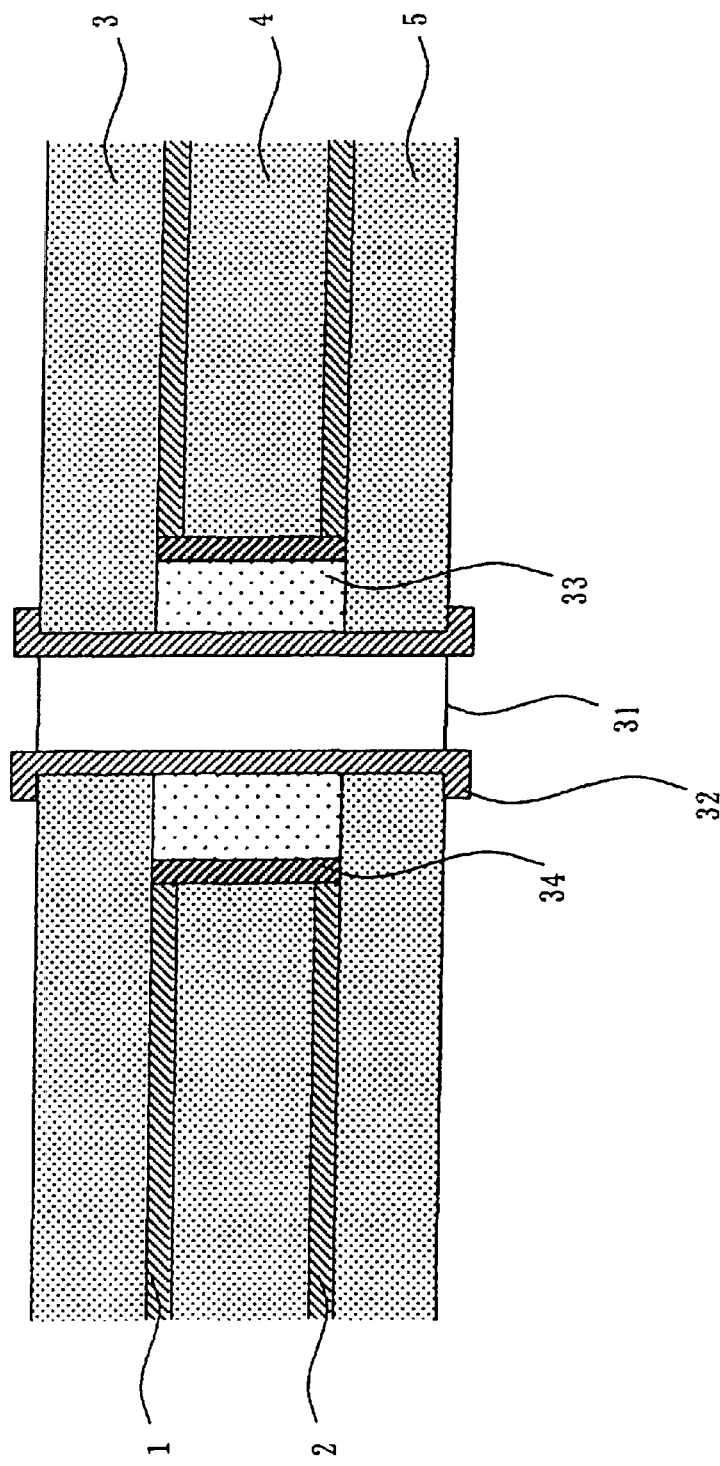
FIG. 11 illustrates a vertical cross-sectional view of a print wiring board according to the related art.

FIGS. 1–3 illustrate an example of a multi-layer wiring board in Embodiment 1. In FIGS. 1–3, same signs are used for elements corresponding to elements in FIGS. 8–10. FIGS. 1–3 illustrate an example of the multi-layer wiring board including the electric power or ground layers 1 and 2 and the insulating layers 3, 4 and 5 in three layers. The electric power or ground layers 1 and 2 are fully coated with a conducting material in two layers.

A first hole 12 includes a plating portion 13 and an insulating portion 14.

A pair of second holes 10 and 11 includes plating portions 10a and 11a for transmitting a respective signal. The plating portions 10a and 11a transmit a differential signal.

The wiring patterns 6 and 7 and the wiring patterns 8 and 9 are wiring patterns of the differential pair.

In this specification, the base board is a board in which the first hole is formed. The base board includes at least an insulating layer and two conductor layers. In some cases, another layer exists on the base board.

The first hole is formed through the base board. The second holes are formed through the base board. The second holes are formed also through the insulating portion 14. It is possible that the second holes are formed also in the other layer on the base board.

The insulating layer is a laminate, prepreg, etc.

The plating portion is also called as a conducting portion. The wiring pattern is a wire in wiring (print wiring).

The differential wiring is wiring in which two wiring patterns are coupled as a pair.

The differential pair is a pair of wires in the differential wiring. FIG. 1 illustrates an example in which the differential wiring including the wiring patterns 6 and 7 and the differential wiring including the wiring patterns 8 and 9 are the differential pairs.

An adjacent pattern is a wiring pattern adjacent to a wiring pattern. The wiring pattern and the adjacent wiring pattern form the differential wiring. For example, in FIG. 1, the wiring pattern 6 and the wiring pattern 7 are adjacent patterns.

Figure 4:
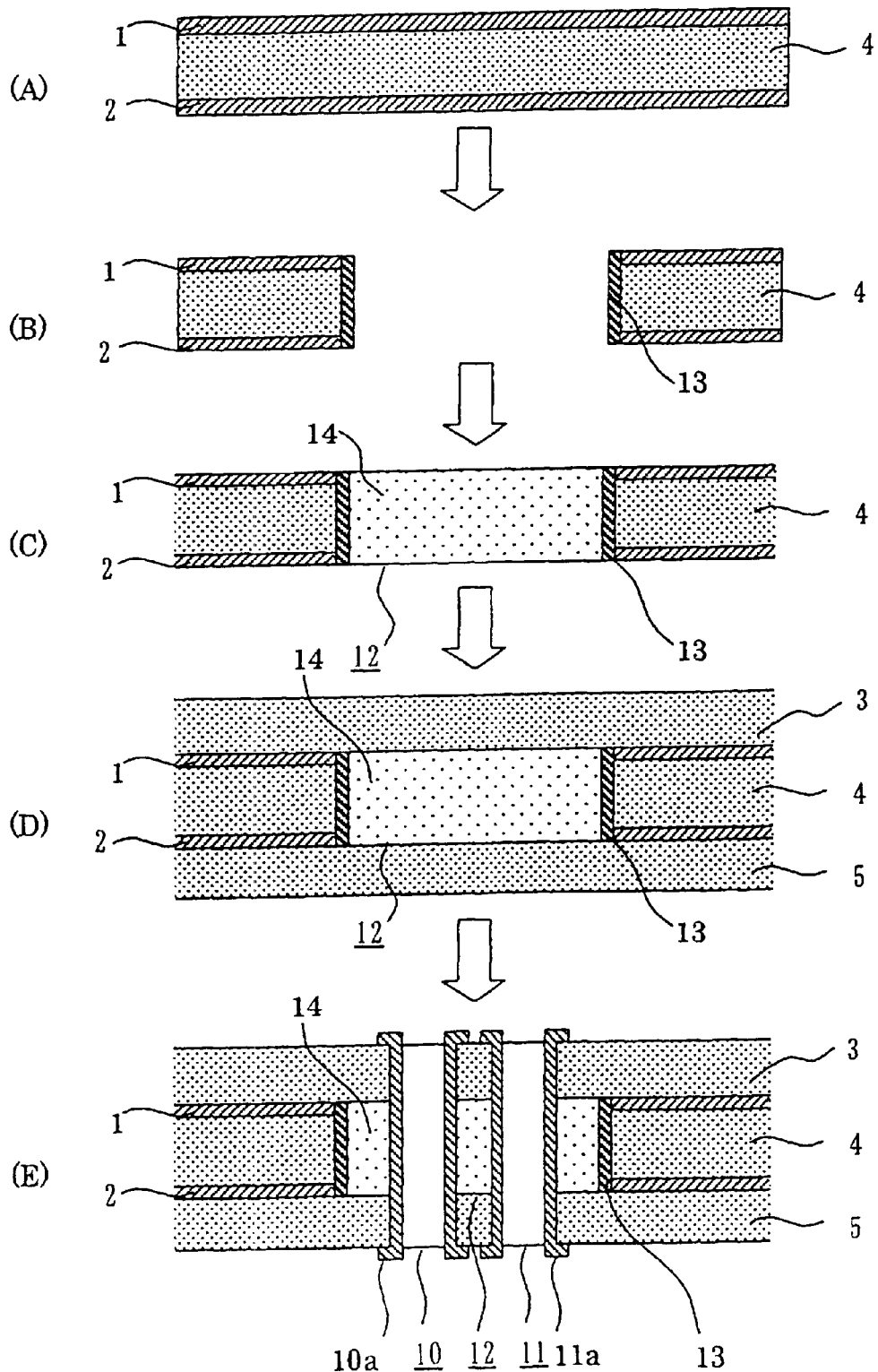
FIG. 4 illustrates an example of steps for manufacturing the multi-layer wiring board according to Embodiment 1.

FIG. 4 illustrates an example of steps for manufacturing the multi-layer wiring board in Embodiment 1. With reference to the cross-sectional view of the multi-layer wiring board of FIG. 2, the steps for manufacturing are explained in FIG. 4.

In FIG. 4, as an example of the multi-layer wiring board, four-layer wiring board including a signal layer as a first layer, electric power or ground layers as second and third layers, and a signal layer as a fourth layer is used for explanation.

At first, a hole is formed through a two-layer wiring board of which both sides are fully coated ((A) of FIG. 4), and the plating portion 13 is formed by plating a circumference of the hole. This is the first hole 12 ((B) of FIG. 4).

The two-layer wiring board of which both sides are fully coated is the two-layer wiring board of which both sides are coated with the conducting material completely. The two-layer wiring board of which both sides are fully coated is a board which functions as an electric power or ground layer.

Then, the first hole 12 is filled with the insulating resin, and the insulating portion 14 is formed ((C) of FIG. 4). In this embodiment, the insulating resin used in the first hole 12 is the same as the insulating resin used in the insulating layer 4.

Further, the insulating layers 3 and 5 are pressed on both sides (an upper surface and a lower surface) of the two-layer wiring board of which both sides are fully coated ((D) of FIG. 4). The wiring patterns 6, 7, 8 and 9 are formed on surfaces of the insulating layers 3 and 5 (both of outer surfaces of the insulating layers 3 and 5), and a four-layer wiring board is formed. The wiring patterns 6, 7, 8 and 9 are not illustrated in the cross-sectional view of (D) of FIG. 4 as they do not appear in the cross-sectional view.

Then, a hole is formed through the four-layer wiring board, and a circumference of the hole is plated with a conducting material. In this way, the second hole 10 is formed. The second hole 11 is formed in a same way ((E) of FIG. 4). The second hole 10 connects the wiring patterns 6 and 8, and the second hole 11 connects the wiring patterns 7 and 9.

In this way, as illustrated in FIG. 3, the second holes 10 and 11 are the holes in a coaxial structure in the differential wiring. In other words, a pair of the second holes 10 and 11 are located symmetrically with respect to a center axis of the first hole 12.

In the multi-layer wiring board including the holes (the second holes 10 and 11 and the first hole 12) as illustrated in FIGS. 1–3, an impedance of the wiring patterns in the differential wiring is controlled. In a same way, by forming the holes in a coaxial structure in the differential wiring, it becomes possible to control the impedance. Accordingly, the impedance of the holes can become equal to the impedance of the wiring patterns. Therefore, no reflection occurs between the wiring patterns and the holes. Hence, a degradation of the signal is prevented.

The differential pair in the first hole is coupled more firmly by making a length 15 between the second holes 10 and 11 shorter than a length 16 between the plating portion 13 in the first hole and the second hole 10. Accordingly, the tolerance to the external noise is increased. The length 15 is a shortest length of the insulating portion 14 (insulation resin) filled in a space between the second holes 10 and 11. The length 16 is a shortest length of the insulating portion 14 filled in a space between the hole 11 (or hole 10) and the plating portion.

A length between the plating portion 13 in the first hole and the second hole 11 is same as the length 16.

In this way, the multi-layer wiring board which has less influence of the external noise can be provided.

As stated, the multi-layer wiring board according to this invention is characterized that the first hole is formed in the multi-layer wiring board including the wiring patterns of the differential signal, the first hole is filled with the insulating resin, and the pair of the second holes for transmitting the differential signal is formed in the first hole.

As stated, according to this embodiment of the invention, the holes in the differential wiring are in a differential coaxial structure. Therefore, it is possible to control the impedance. Hence, between the wiring patterns of which impedance is controlled, the reflection due to the discontinuance of the impedance does not occur. Further, the degradation of the signal can be prevented.

Embodiment 2.

In Embodiment 1, the insulating resin used in the insulating layers 3–5 is used in the insulating portion 14. In Embodiment 2, an insulating resin which has a higher dielectric constant than the insulating resin used in the insulating layers 3–5 is used in the insulating portion 14. By using the insulator with the higher dielectric constant, an electromagnetic field is concentrated. In this way, the wiring patterns (adjacent patterns) forming the differential wiring are coupled each other by using the electromagnetic field.

Therefore, the wiring patterns are coupled more firmly by strengthening the electromagnetic field.

In this way, by using the insulating resin with the higher dielectric constant, it is possible to strengthen the coupling within the hole and increase the tolerance to the external noise.

Since the resin with the higher dielectric constant is used for filling the hole at the time of forming the hole, the coupling within the differential pair is strengthened. Further, the tolerance to the external noise can be increased.

Embodiment 3.

Figure 5:
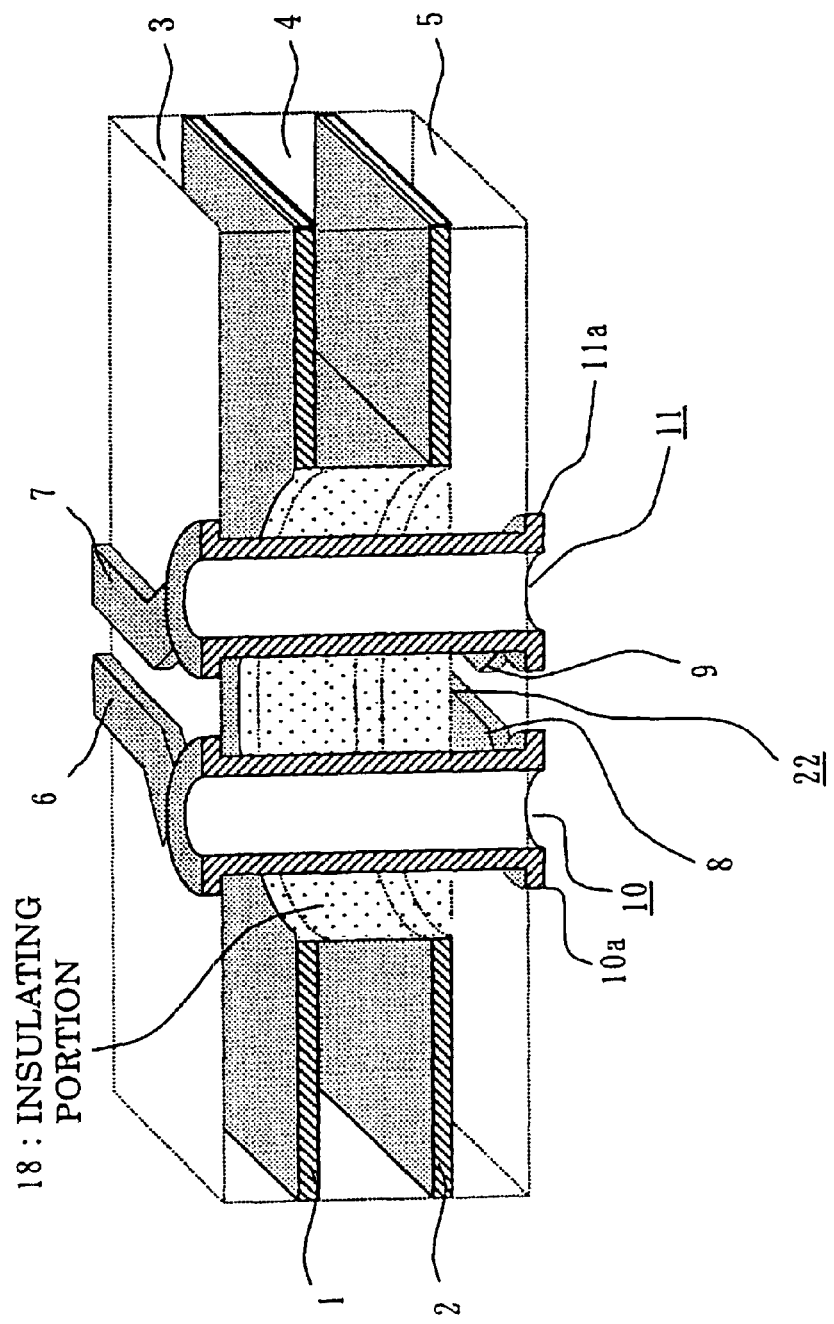
FIG. 5 illustrates an example of a structure of the multi-layer wiring board according to Embodiment 3 of this invention.
Figure 6:
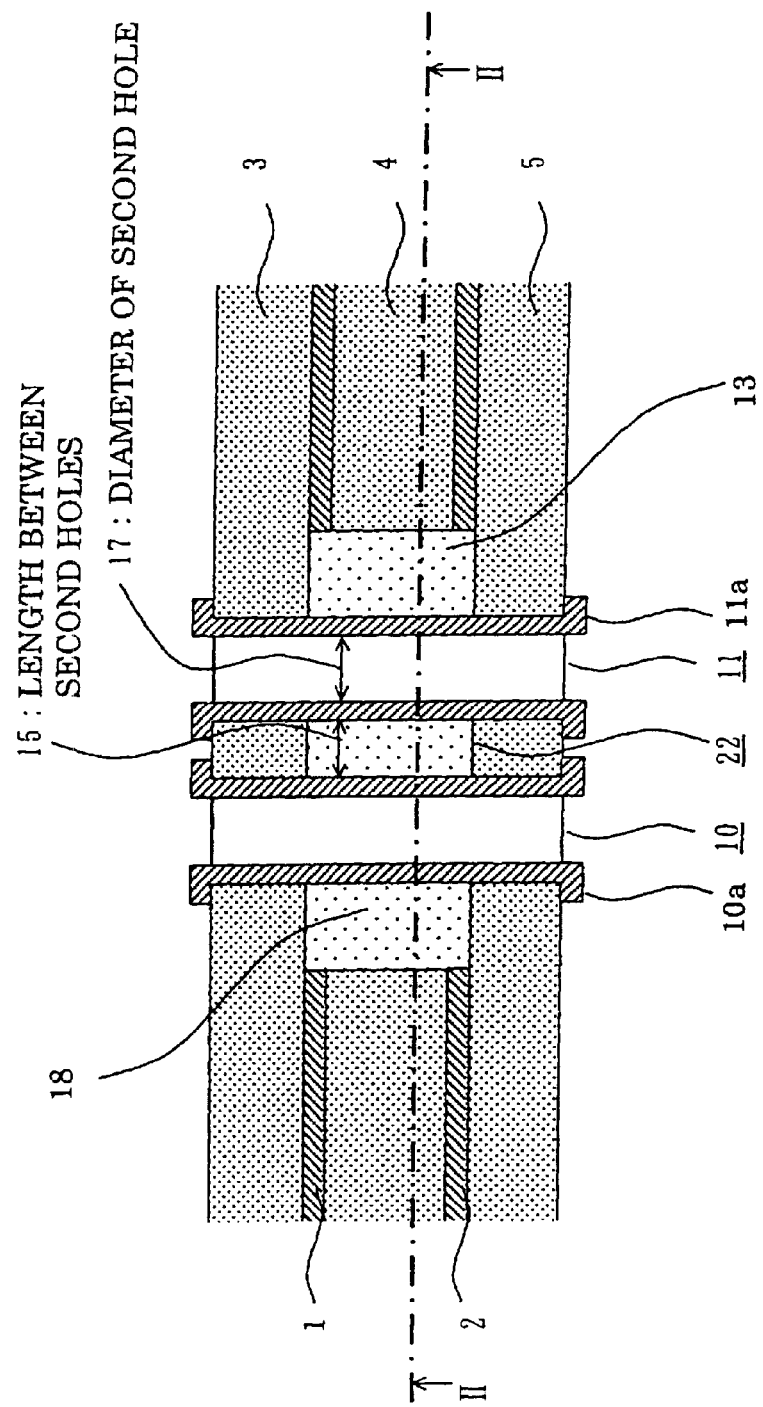
FIG. 6 illustrates a partially-broken perspective view of the multi-layer wiring board for showing a cross-sectional structure in FIG. 5.
Figure 7:
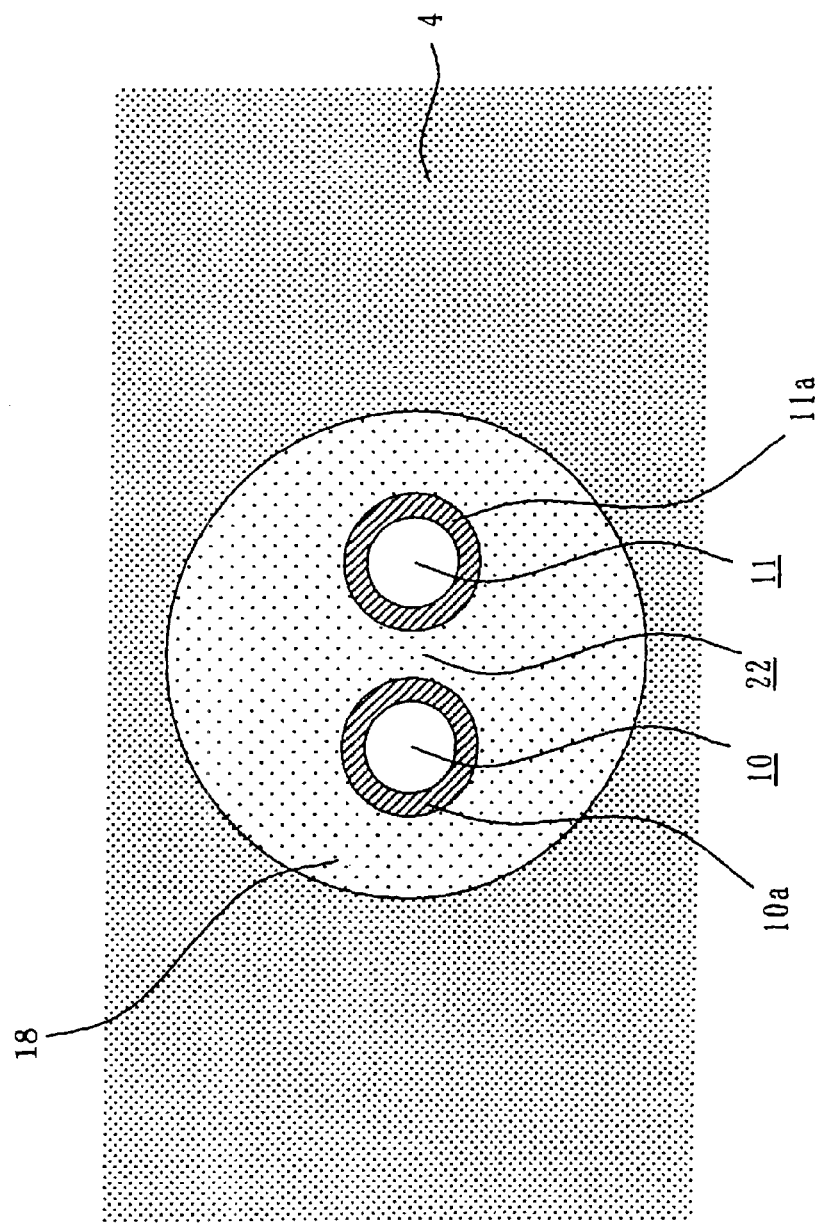
FIG. 7 illustrates a cross-sectional structure along II—II line in FIG. 6.

FIGS. 5–7 illustrate an example of the multi-layer wiring board according to Embodiment 3. Same signs are used for corresponding elements in FIGS. 1–3.

In FIGS. 5–7, a first hole 22 in the multi-layer wiring board includes an insulating portion 18. However, the first hole does not includes a plating portion.

When the first hole 22 is formed in the multi-layer wiring board in FIGS. 5–7, there is no plating. The first hole 22 without plating is filled with the insulating resin.

For filling the hole, an insulating resin with a higher dielectric constant than the insulating resin used in the insulating layers 3–5 is used. Therefore, the insulating portion 18 in FIGS. 5–7 has a higher dielectric constant than the insulating layers 3–5.

By using the insulating resin with the higher dielectric constant, the coupling within the hole is strengthened, and the tolerance to the external noise can be increased. This is same as in Embodiment 2. Further, by using the insulating resin with the higher dielectric constant, it is possible to omit plating at a time of forming the first hole 22. Therefore, a step for manufacturing can be reduced. Hence, a possibility of an error in the manufacturing steps can be reduced.

Accordingly, in Embodiment 3, the multi-layer wiring board which can reduce a rate of error occurrence can be provided while maintaining the tolerance to the external noise.

Since the resin with the higher dielectric constant is used for filing the hole at the time of forming the hole and plating of the first hole is omitted, a step for manufacturing can be reduced while maintaining the tolerance to the external noise. Hence, a possibility of the error can be reduced.

Embodiment 4.

Further, in the multi-layer wiring board in Embodiments 2 and 3, the coupling between the differential pair within the hole can be strengthened by making the length 15 shorter than the length 16 illustrated in FIG. 2 of Embodiment 1 and using an insulating resin with a higher dielectric constant in the insulating portion 18. Therefore, it is possible to provide the multi-layer wiring board with less influence of the external noise.

Further, the multi-layer wiring board in FIGS. 5–7 can be the multi-layer wiring board in which the insulating resin with the higher dielectric constant is used in the insulating portion 18, the length 15 is made shorter than the length 16, and the plating portion is not provided in the first hole 22. This kind of multi-layer wiring board has less influence of the external noise. Further, it is possible to reduce the error in the manufacturing steps.

As stated, the multi-layer wiring board in this embodiment is characterized that the length between the pair of the second holes formed within the first hole is made shorter than a length between an electrode and the first hole.

By shortening the length between the holes in the differential wiring and using the resin with the higher dielectric constant for filling the holes at the time of forming the holes, the coupling within the differential pair can be strengthened. Hence, the tolerance to the external noise can be increased.

Embodiment 5.

In this embodiment, explanations are made on a case of optimizing a diameter of the second hole in the multi-layer wiring board in Embodiments 2–4.

FIG. 6 illustrates a diameter 17 of the second hole 11. The diameter 17 of the second hole 11 is an inner diameter of the second hole 11. Since the second hole 10 is same as the second hole 11, a diameter of the second hole 10 is also expressed as the diameter 17.

By optimizing the diameter 17 of the second hole and the length 15 between the second holes so that an impedance is matched with other wiring patterns, the reflection between the wiring patterns and the hole can be suppressed. Hence, the degradation of the signal can be prevented.

Optimization can be achieved by changing the diameter 17 of the second holes 10 and 11. The diameter 17 of the second hole 10 is equal to the diameter 17 of the second hole 11.

Optimization is performed so that an impedance of the second holes 10 and 11 is equal to an impedance of the wiring patterns 6 and 7 and an impedance of the wiring patterns 8 and 9.

The impedance of the second holes 10 and 11 changes according to a coupling power (=coupling amount) of the second holes 10 and 11 in an electromagnetic field. The coupling power of the second holes 10 and 11 in the electromagnetic field can be controlled by changing the length 15 and the diameter 17.

At an end, optimization is performed so that the impedance of the second holes is equal to the impedance of the wiring patterns. The length 15 and the diameter 17 are calculated so that the impedance of the second holes is equal to the impedance of the wiring patterns.

By optimizing the length between the holes in the differential wiring and the diameter of the holes in the above differential wiring, it is possible to suppress the reflection between the wiring patterns and the holes in the differential wiring. Hence, the degradation of the signal can be prevented.

Embodiment 6.

In the multi-layer wiring board in Embodiment 1, the reflection between the wiring patterns and the holes can be suppressed and the degradation of the signal can be prevented by optimizing the length 15 and the diameter 17 as explained in Embodiment 5.

Further, by optimizing the length 15 and the diameter 17, the coupling between the wiring patterns and the holes can be strengthened, and plating for forming the plating portion 13 can be omitted. Therefore, even in a case that the insulator used in the insulating portion 14 is same as the insulator used in the insulating layers 3, 4 and 5 as in Embodiment 1, the multi-layer wiring board without the plating portion 13 can be realized by matching the impedance of the wiring patterns and the impedance of the pair of the second holes 10 and 11.

Embodiment 7.

In the above embodiments, an example of the multi-layer wiring board in four layers was explained. However, it is not limited to the multi-layer wiring board in four layers.

This invention can be realized in the multi-layer wiring board including at least two conductor layers.

Further, as an example of the insulator for filing the insulating portion, the insulating resin was used for explanation. However, it is not limited to the insulating resin. As far as it is the insulator, other materials can be used.

Embodiment 8.

In Embodiments 2 and 3, explanations were made on a case of using the insulator with the higher dielectric constant in the insulating portion 14 than the insulator used in the insulating layers 3, 4 and 5.

As materials used in the insulating layers 3, 4 and 5 and the insulating portion 18, there are FR-4, BT resin, PPO (Polyphenyleneoxide), etc. However, it is not limited to these materials.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A multi-layer wiring board comprising:
a base board including two conductor layers, two insulating layers disposed between the two conductor layers, and at least one of a power layer and a ground layer disposed between the two insulating layers;
a first hole, formed through the base board, including an insulating portion filled with an insulator; and
a pair of second holes formed within the first hole through the insulating portion.

2. The wiring board according to claim 1,
wherein each of the second holes includes a conducting portion for transmitting a differential signal.

3. The wiring board according to claim 2,
wherein the insulating portion is filled with an insulator which has a higher dielectric constant than an insulator in the insulating layers.

4. The wiring board according to claim 1,
wherein the pair of the second boles is located symmetrically each other with respect to a center axis of the hole for forming a coaxial structure.

5. The wiring board according to claim 4,
wherein the insulating portion is filled with an insulator which has a higher dielectric constant than art insulator in the insulating layers.

6. The wiring board according to claim 4,
wherein the second holes are formed through the insulating layers,
wherein the conducting layers include at least two pairs of wiring patterns formed on the upper surface and the lower surface of the base board,
wherein the pair of the second holes connects the two pairs of the wiring patterns,
wherein the pair of the second holes is formed by calculating a diameter of the pair of the second holes and a length between the pair of the second holes based on an impedance of the pair of the second holes and an impedance of the two pairs of the wiring patterns.

7. The wiring board according to claim 4, wherein the conductor layers are coated with a conducting material.

8. The wiring board according to claim 1,
wherein the insulating portion is filled with an insulator which has a higher dielectric constant than an insulator in the insulating layers.

9. The wiring board according to claim 8, wherein the first hole includes the insulating portion without forming a plating portion between the first hole and the insulating portion.

10. The wiring board according to claim 1,
wherein the second holes are formed through the insulating layers,
wherein the conductor layers include at least two pairs of wiring patterns formed on the upper surface and the lower surface of the base board,
wherein the pair of the second holes connects the two pairs of the wiring patterns,
wherein the pair of the second holes is formed by calculating a diameter of the pair of the second holes and a length between the pair of the second holes based on an impedance of the pair of the second holes and an impedance of the two pairs of the wiring patterns.

11. The wiring board according to claim 1, wherein the conductor layers are coated with a conducting material.

12. The wiring board according to claim 11,
wherein the first hole is formed at least through the two conductor layers.
wherein the pair of the second holes is formed by forming the insulating layers on an upper surface and a lower surface of the two conductor layers, forming a plurality of wiring patterns on an upper surface and a lower surface of the insulating layer, and forming holes through at least five layers of the two conductor layers, two insulating layers, and the at least one of the power layer and ground layer.

13. A wiring board comprising:
abase board;
a first hole, formed through the base board, including an insulating portion filled with an insulator; and
a pair of second holes formed within the first hole through the insulating portion, wherein a shortest length of the insulator filled between the pair of the second holes is shorter than a shortest length of the insulator filled between the first hole and one of the second holes.

14. The wiring board according to claim 13, wherein the insulating portion is filled with an insulator which has a higher dielectric constant than an insulator in the insulating layers.

15. A wiring board comprising:
a base board;
a first hole, formed through the base board, including an insulating portion filled with an insulator; and
a pair of second holes formed within the first hole through the insulating portion,
wherein each of the second holes includes a conducting portion for transmitting a differential signal,
wherein a shortest length of the insulator filled between the pair of the second holes is shorter than a shortest length of the insulator filled between the first hole and one of the second holes.

16. A wiring board comprising:
a base board;
a first hole, formed through the base board, including art insulating portion filled with an insulator; and
a pair of second holed formed within the first hole through the insulating portion,
wherein the pair of the second holes is located symmetrical to each other with respect to a center axis of the first hole for forming a coaxial structure,
wherein a shortest length of the insulator filled between the pair of the second holes is shorter than a shortest length of the insulator filled between the first hole and one of the second holes.

* * * * *